(12) United States Patent
Cheng et al.

(10) Patent No.: US 10,509,278 B2
(45) Date of Patent: Dec. 17, 2019

(54) CHIP ON FILM (COF) SINGLE-LAYER FLEXIBLE PRINTED CIRCUIT BOARD AND LIQUID CRYSTAL DISPLAY (LCD) HAVING THE SAME

(71) Applicant: Wuhan China Star Optoelectronics Technology Co., Ltd., Wuhan, Hubei (CN)

(72) Inventors: Yan Cheng, Hubei (CN); Gege Zhou, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/009,902

(22) Filed: Jun. 15, 2018

(65) Prior Publication Data

US 2019/0250446 A1 Aug. 15, 2019

Related U.S. Application Data

(63) Continuation of application No. PCT/CN2018/079123, filed on Mar. 15, 2018.

(30) Foreign Application Priority Data

Feb. 9, 2018 (CN) .......................... 2018 1 0134235

(51) Int. Cl.
*G02F 1/1345* (2006.01)
*G02F 1/1333* (2006.01)
(Continued)

(52) U.S. Cl.
CPC .... *G02F 1/13452* (2013.01); *G02F 1/133308* (2013.01); *H05K 1/028* (2013.01);
(Continued)

(58) Field of Classification Search
CPC .......... G02F 1/13452; G02F 1/133308; G02F 2001/133317; H05K 1/189; H05K 1/028; H05K 2201/10136; H05K 2201/056
(Continued)

(56) References Cited

U.S. PATENT DOCUMENTS

2015/0153607 A1* 6/2015 Chen ................. G02F 1/133308
  349/65
2018/0063942 A1* 3/2018 Kim ..................... H05K 3/4691
2018/0196300 A1* 7/2018 Jung ................... G02F 1/13452

* cited by examiner

*Primary Examiner* — Nathanael R Briggs
*Assistant Examiner* — William D Peterson
(74) *Attorney, Agent, or Firm* — Leong C. Lei

(57) ABSTRACT

The present disclosure relates to a chip on film (COF) single-layer flexible printed circuit board, including: a flexible packaging substrate including a bonding area and a controlling chip being packaged on the flexible packaging substrate. The bonding area of the flexible packaging substrate is configured to bond with a bonding area of an array substrate. The controlling chip electrically connects to the bonding area of the flexible packaging substrate. The controlling chip and the bonding area of the flexible packaging substrate are configured on the same side of the flexible packaging substrate, and a portion of the flexible packaging substrate is bent at least one time. As such, the controlling chip faces away the array substrate, the cost and the complexity of the post-process may be reduced, and the COF single-layer flexible printed circuit board may be shipped in the folding manner.

4 Claims, 2 Drawing Sheets

(51) Int. Cl.
    *H05K 1/18*         (2006.01)
    *H05K 1/02*         (2006.01)
(52) U.S. Cl.
    CPC . *H05K 1/189* (2013.01); *G02F 2001/133317* (2013.01); *H05K 2201/056* (2013.01); *H05K 2201/10136* (2013.01)
(58) Field of Classification Search
    USPC .......................................................... 349/58
    See application file for complete search history.

US 10,509,278 B2

CHIP ON FILM (COF) SINGLE-LAYER FLEXIBLE PRINTED CIRCUIT BOARD AND LIQUID CRYSTAL DISPLAY (LCD) HAVING THE SAME

CROSS REFERENCE TO RELATED APPLICATIONS

This application is a continuing application of PCT Patent Application No. PCT/CN2018/079123, entitled "CHIP ON FILM (COF) SINGLE-LAYER FLEXIBLE PRINTED CIRCUIT BOARD AND LIQUID CRYSTAL DISPLAY (LCD) HAVING THE SAME", filed on Mar. 15, 2018, which claims priority to Chinese Patent Application No. 201810134235.8, filed on Feb. 9, 2018, both of which are hereby incorporated in its entireties by reference.

BACKGROUND

1. Technical Field

The present disclosure relates to display field, and more particularly to a chip on film (COF) single-layer flexible printed circuit board and a liquid crystal display (LCD) having the same.

2. Description of Related Art

As the demanding of the display devices has increased, the display size has been demanded greatly. Especially, with respect to the mobile display products, narrow frame and high screen ratio have been further demanded. That is, the size of the non-display area around the display area is expected to be smaller and smaller.

To achieve the higher screen ratio, the glass substrate usually adopts the chip on film (COF) technique, which is arranging the integrate circuit (IC) bonding on the flexible printed circuit (FPC) instead of arranging the IC bonding on the thin film transistor (TFT) array substrate, so as to reduce the size of the bonding area of the array substrate and to increase the display area.

As show in FIG. 1, FIG. 1 is a cross-sectional view of a LCD adopting a conventional COF flexible printed circuit board. The COF flexible printed circuit board 1' may adopt a single-layer wiring. A chip 2' and a copper area of a bonding area 10' are arranged on the same side of the COF flexible printed circuit board 1'. The bonding area 10' connects to a boding area of the TFT array substrate 3'. A color film substrate 4' is configured on the TFT array substrate 3'.

FIG. 2 is a schematic view illustrating the COF flexible printed circuit board 1' has been bent. After the COF flexible printed circuit board 1' is bent, the chip 2' may be closely arranged above a reflective sheet of a backlight module 5' of a frame 6'. However, the chip 2' may generate heat, and optical performance of the backlight module may be reduced, such as Newton rings, and waving. Therefore, the COF flexible printed circuit board requires to be shipped in an unfolding manner.

Alternatively, the COF flexible printed circuit board 1' may adopt a double-layer wiring, such that the chip 2' and the copper area of the bonding area 10' may be arranged on different sides of the COF flexible printed circuit board 1', and the COF flexible printed circuit board may be shipped in the folding manner. However, the cost and complexity of the manufacturing process may be increased.

SUMMARY

In one aspect, the present disclosure relates to a chip on film (COF) single-layer flexible printed circuit board, including: a flexible packaging substrate including: a bonding area, wherein the bonding area of the flexible packaging substrate is configured to bond with a bonding area of an array substrate; a controlling chip being packaged on the flexible packaging substrate, wherein the controlling chip electrically connects to the bonding area of the flexible packaging substrate; wherein the controlling chip and the bonding area of the flexible packaging substrate are configured on the same side of the flexible packaging substrate, a portion of the flexible packaging substrate is bent at least one time, such that the controlling chip faces away the array substrate; the flexible packaging substrate includes at least one straight section, at least one bending section, and a folding section, wherein the straight section is spaced apart from the bending section.

The flexible packaging substrate includes the at least one straight section, the at least one bending section, and one folding section, wherein a number of the straight section is equal to a number of the bending section;

The bending section and the straight section are spaced apart from each other in sequence, an end portion of a first straight section faces toward a display area of a liquid crystal display (LCD), and the folding section is disposed on one side of a last bending section away from a last straight section.

The bonding area of the flexible packaging substrate is configured on a top surface of the first straight section, and the bonding area of the flexible packaging substrate engages with the bonding area of the array substrate, and the controlling chip is configured on a bottom surface of the folding section.

The flexible packaging substrate includes at least two straight sections, at least two bending sections, and one folding section, wherein a number of the straight section is equal to a number of the bending section; the bending section and the straight section are spaced apart from each other in sequence, an end portion of a first straight section faces away from a display area of a LCD, and the folding section is disposed on one side of a last bending section away from a last straight section.

The bonding area of the flexible packaging substrate is configured on a bottom surface of the first straight section, and the bonding area of the flexible packaging substrate engages with the bonding area of the array substrate, and the controlling chip is configured on a bottom surface of the folding section.

In another aspect, the present disclosure relates to a LCD, including: a frame structure, a backlight module arranged within the frame structure, and a LCD panel configured on the backlight module, wherein the LCD panel at least includes an array substrate, a color film substrate, a liquid crystal layer, and a COF flexible printed circuit board connected to the array substrate; the COF flexible printed circuit board includes: a flexible packaging substrate including a bonding area, wherein the bonding area of the flexible packaging substrate bonds with a bonding area of an array substrate; a controlling chip being packaged on the flexible packaging substrate, wherein the controlling chip electrically connects to the bonding area of the flexible packaging substrate; wherein the controlling chip and the bonding area of the flexible packaging substrate are arranged on the same side of the flexible packaging substrate, a portion of the flexible packaging substrate is bent at least one time, such that the controlling chip faces away the array substrate; the flexible packaging substrate includes at least one straight section, at least one bending section, and a folding section, wherein the straight section is spaced apart from the bending section.

Within the LCD panel, the array substrate is disposed on the color film substrate, and the bonding area of the array substrate is configured on a bottom surface of the array substrate; the flexible packaging substrate includes the at least one straight section, the at least one bending section, and one folding section, wherein a number of the straight section is equal to a number of the bending section, the bending section and the straight section are spaced apart from each other in sequence, an end portion of a first straight section faces toward a display area of a LCD, and the folding section is disposed on one side of a last bending section away from a last straight section.

The bonding area of the flexible packaging substrate is configured on a top surface of the first straight section, and the bonding area of the flexible packaging substrate engages with the bonding area of the array substrate, and the controlling chip is configured on a bottom surface of the folding section.

Within the LCD panel, the array substrate is disposed below the color film substrate, and the bonding area of the array substrate is configured on a top surface of the array substrate; the flexible packaging substrate includes at least two straight sections, at least two bending sections, and one folding section, wherein a number of the straight section is equal to a number of the bending section; the bending section and the straight section are spaced apart from each other in sequence, an end portion of a first straight section faces away from a display area of a LCD, and the folding section is configured on one end of a last bending section, wherein the folding section is disposed on one side of the last bending section away from the last straight section.

The bonding area of the flexible packaging substrate is configured on a bottom surface of the first straight section, and the bonding area of the flexible packaging substrate engages with the bonding area of the array substrate, and the controlling chip is configured on a bottom surface of the folding section.

In view of the above, the present disclosure relates to the COF single-layer flexible printed circuit board and the LCD. The bonding area of the COF single-layer flexible printed circuit board and the controlling chip are configured on the same side of the COF single-layer flexible printed circuit board. The relative position between the color film substrate and the array substrate of the liquid crystal panel may be adjusted. The COF single-layer flexible printed circuit board may be bent once or twice after the COF single-layer flexible printed circuit board bonds with the array substrate. Such that the controlling chip may face away from the array substrate, and the controlling chip may be accommodated in the middle frame of the frame structure to improve the heat dissipation and the COF single-layer flexible printed circuit board may be shipped in the folding manner. Moreover, the COF single-layer flexible printed circuit board may adopt the single-layer wiring, such that the cost and the complexity of the post-process may be further reduced.

DETAILED DESCRIPTION

Following embodiments of the invention will now be described in detail hereinafter with reference to the accompanying drawings. To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments In the following description, in order to avoid the known structure and/or function unnecessary detailed description of the concept of the invention result in confusion, well-known structures may be omitted and/or functions described in unnecessary detail.

Figure 3:
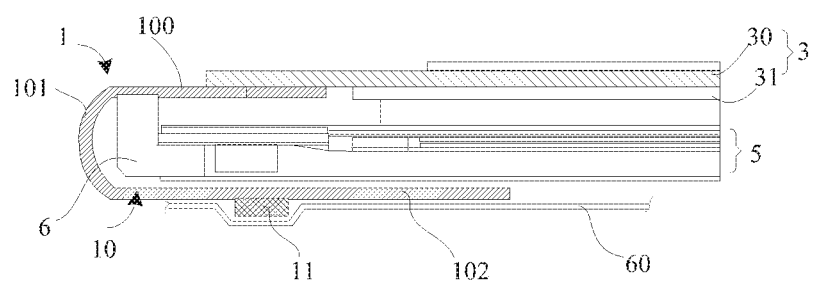
FIG. 3 is a schematic view of a COF single-layer flexible printed circuit board in accordance with a first embodiment of the present disclosure.
Figure 4:
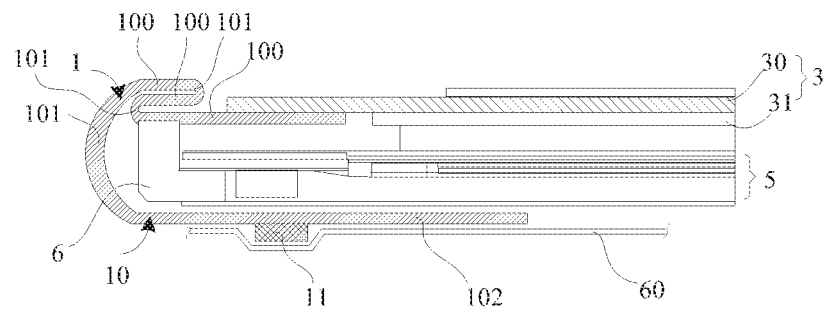
FIG. 4 is a schematic view of a COF single-layer flexible printed circuit board in accordance with a second embodiment of the present disclosure.

Referring to FIG. 3, FIG. 3 is a schematic view of a chip of film (COF) single-layer flexible printed circuit board in accordance with one embodiment of the present disclosure. In one example, a liquid crystal display (LCD) at least includes a frame structure 6, a backlight module configured within the frame structure 6, and a LCD panel 3 configured on the frame structure 6. The LCD panel 3 at least includes an array substrate 30, a color substrate 31, and a liquid crystal layer (not shown) configured between the array substrate 30 and the color substrate 31. In one example, the array substrate 30 is configured on the color substrate 31. A bonding area is configured on a bottom surface of the array substrate 30.

The LCD further includes a COF single-layer flexible printed circuit board 1 connected to the array substrate 30.

The COF single-layer flexible printed circuit board 1 may include a flexible packaging substrate 10 including a bonding area, wherein the bonding area of the flexible packaging substrate 10 bonds with the bonding area of the array substrate 30. As shown in FIG. 3, the flexible packaging substrate 10 contacts with the bonding area of the array substrate 30. The flexible packaging substrate 10 further includes at least one straight section, at least one bending section, and a folding section. The straight section is spaced apart from the bending section.

The COF single-layer flexible printed circuit board 1 further includes a controlling chip 11 being packaged on the flexible packaging substrate 10. The controlling chip 11 electrically connects to the bonding area on the straight section 100 via a wiring, such as an input end wiring and an output end wiring.

Specifically, the flexible packaging substrate 10 includes the at least one straight section 100, the at least one bending section 101, and one folding section 102. A number of the straight section 100 is equal to a number of the bending section 101. The bending section 101 and the straight section 100 are spaced apart from each other in sequence. An end portion of a first straight section of the straight sections 100 faces toward a display area of a liquid crystal display (LCD). The folding section 102 is disposed on one side of a last bending section 101 away from a last straight section 100.

Figure 1:
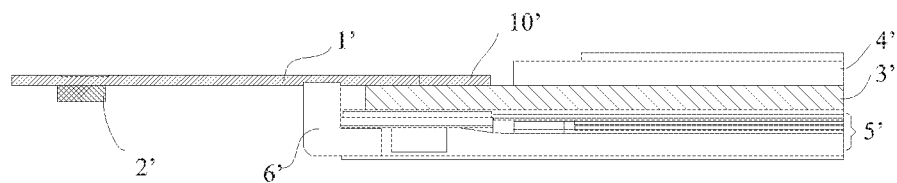
FIG. 1 is a cross-sectional view of a liquid crystal display (LCD) adopting a conventional chip on film (COF) flexible printed circuit board.
Figure 2:
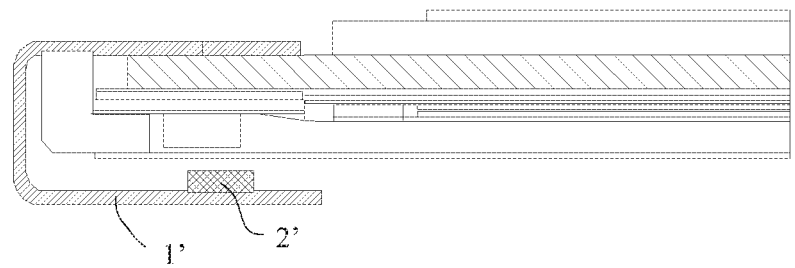
FIG. 2 is a schematic view illustrating the COF flexible printed circuit board has been bent.

In one example, as shown in FIG. 2, the flexible packaging substrate 10 may include one straight section 100 and one bending section 101. The bending section 101 is disposed on one side of the straight section 100 away from the display area of the LCD. The folding section 102 is disposed on one side of the bending section 101 away from the straight section 100. The bonding area of the flexible packaging substrate 10 is arranged on a top surface of at least one portion of the straight section 100.

In one example, as shown in FIG. 3, the flexible packaging substrate 10 may include two straight sections 100, two bending sections 101, and one folding section 102. The flexible packaging substrate 10 requires to be bent for three times. It is noted that, in another example, the flexible packaging substrate 10 may include more number of the straight sections and the bending sections.

In one example, the COF single-layer flexible printed circuit board 1 may adopt a single-layer wiring. Specifically, the controlling chip 11 and the bonding area of the COF single-layer flexible printed circuit board 1 are configured on the same side of the flexible packaging substrate 10. A portion of the flexible packaging substrate 10 is bent for at least one time (or be bent for an odd-number of times). Such that the controlling chip 11 may face away the array substrate 30, such as the controlling chip 11 may face downward as shown in the figure, and controlling chip 11 may be accommodated in a middle frame 60 of the frame structure 6.

In one example, it is noted that the COF single-layer flexible printed circuit board 1 may adopt the single-layer wiring. The controlling chip 11 may be accommodated in the middle frame 60 and may face downward by bending the flexible packaging substrate 10 once. As such, the cost may be reduced, the heat dissipation may be improved, the COF flexible printed circuit board may be shipped in a folding manner, and the manufacturing process may be simplified.

Figure 5:
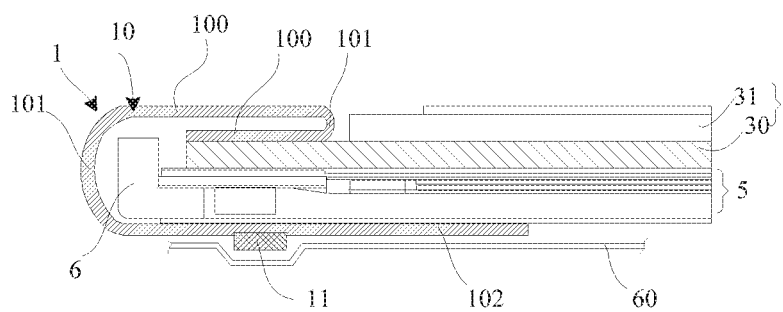
FIG. 5 is a schematic view of a COF single-layer flexible printed circuit board in accordance with a third embodiment of the present disclosure.

As shown in FIG. 5, FIG. 5 is a schematic view of a COF single-layer flexible printed circuit board in accordance with another embodiment of the present disclosure. The differences between the present embodiment and the embodiment shown in FIG. 3 reside in that the array substrate 30 of the LCD panel 3 is disposed below the color substrate 31 and the flexible packaging substrate 10 is bent twice.

Specifically, in one example, the bonding area of the array substrate 30 is configured on a top surface of the array substrate 30.

The flexible packaging substrate 10 includes at least two straight sections 100, at least two bending sections 101, and one folding section 102. The number of the straight sections 100 is equal to the number of the bending sections 101. The bending section 101 and the straight section 100 are spaced apart from each other in sequence. The end portion of the first straight section of the straight sections 100 faces away from the display area of the LCD. The folding section 102 is disposed on one side of the last bending section away from the last straight section.

In one example, as shown in FIG. 5, the flexible packaging substrate 10 may include two straight sections 100 and two bending sections 101. The first bending section is disposed on one side of the first straight section closed to the display area of the LCD. A second straight section is disposed on one side of the first bending section away from the first straight section. A second bending section is disposed on one side of the second straight section away from the first bending section. The folding section 102 is disposed on one side of the second bending section away from the second straight section. In the example, the flexible packaging substrate 10 requires to be bent twice.

Figure 6:
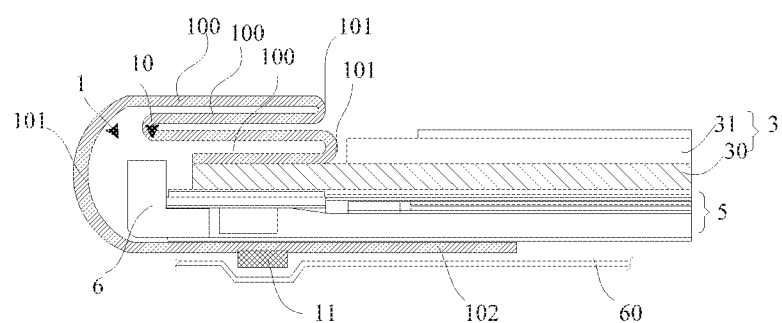
FIG. 6 is a schematic view of a COF single-layer flexible printed circuit board in accordance with a fourth embodiment of the present disclosure.

In one example, as shown in FIG. 6, the flexible packaging substrate 10 may include three straight sections 100, three bending sections 101, and one folding section 102. The flexible packaging substrate 10 requires to be bent for four times. It is noted that, in another example, the flexible packaging substrate 10 may include more number of the straight sections and the bending sections.

The bonding area of the COF single-layer flexible printed circuit board is disposed on a bottom surface of the first straight section. The bonding area of the COF single-layer flexible printed circuit board engages with the bonding area of the array substrate 30. The controlling chip 11 is disposed on a bottom surface of the folding section 102.

It is noted that the COF single-layer flexible printed circuit board 1 may adopt the single-layer wiring. The controlling chip 11 may be accommodated in the middle frame 60 of the frame structure 6 and may face downward by bending the flexible packaging substrate 10 for an even-number of times. As such, the cost may be reduced, the heat dissipation may be improved, the COF flexible printed circuit board may be shipped in the folding manner, and the manufacturing process may be simplified.

In view of the above, the present disclosure relates to the COF single-layer flexible printed circuit board and the LCD. The bonding area of the COF single-layer flexible printed circuit board and the controlling chip are configured on the same side of the COF single-layer flexible printed circuit board. The relative position between the color film substrate and the array substrate of the liquid crystal panel may be adjusted. The COF single-layer flexible printed circuit board may be bent once or twice after the COF single-layer flexible printed circuit board bonds with the array substrate. Such that the controlling chip may face away from the array substrate, and the controlling chip may be accommodated in the middle frame of the frame structure to improve the heat dissipation and the COF single-layer flexible printed circuit board may be shipped in the folding manner. Moreover, the COF single-layer flexible printed circuit board may adopt the single-layer wiring, such that the cost and the complexity of the post-process may be further reduced.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A chip on film (COF) single-layer flexible printed circuit board, comprising:
    a flexible packaging substrate comprising a bonding area, wherein the bonding area of the flexible packaging substrate is configured to bond with a bonding area of an array substrate;
    a controlling chip being packaged on the flexible packaging substrate, wherein the controlling chip electrically connects to the bonding area of the flexible packaging substrate;
    wherein the flexible packaging substrate is a single-layer flexible printed circuit board, and the controlling chip and the bonding area of the flexible packaging substrate are configured on the same side of the flexible packaging substrate, a portion of the flexible packaging substrate is bent at least two times, wherein the flexible packaging substrate comprises at least two straight sections, at least two bending sections, and one folding section, wherein a number of the straight section is equal to a number of the bending section;
    the bending section and the straight section are spaced apart from each other in sequence, an end portion of a first straight section of the straight sections faces away from a display area of a LCD, and the folding section is disposed on one side of a last bending section away from a last straight section, such that the controlling chip faces away the array substrate so that heat generated by the controlling chip does not reduce optical performance of a backlight module in a LCD device utilizing the chip on film (COF) single-layer flexible printed circuit board.

2. The COF single-layer flexible printed circuit board according to claim 1, wherein the bonding area of the flexible packaging substrate is configured on a bottom surface of the first straight section, and the bonding area of the flexible packaging substrate engages with the bonding area of the array substrate, and the controlling chip is configured on a bottom surface of the folding section.

3. A LCD device, at least comprising:
    a frame structure, a backlight module arranged within the frame structure, and a LCD panel configured on the backlight module, wherein the LCD panel at least comprises an array substrate, a color film substrate, a liquid crystal layer, and a COF flexible printed circuit board connected to the array substrate;
    the COF flexible printed circuit board comprises:
    a flexible packaging substrate comprising a bonding area, wherein the bonding area of the flexible packaging substrate bonds with a bonding area of an array substrate;
    a controlling chip being packaged on the flexible packaging substrate, wherein the controlling chip electrically connects to the bonding area of the flexible packaging substrate;
    wherein the flexible packaging substrate is a single-layer flexible printed circuit board, and the controlling chip and the bonding area of the flexible packaging substrate are arranged on the same side of the flexible packaging substrate, a portion of the flexible packaging substrate is bent at least two times, wherein within the LCD panel, the array substrate is disposed below the color film substrate, and the bonding area of the array substrate is configured on a top surface of the array substrate;
    the flexible packaging substrate comprises at least two straight sections, at least two bending sections, and one folding section, wherein a number of the straight section is equal to a number of the bending section;
    the bending section and the straight section are spaced apart from each other in sequence, an end portion of a first straight section of the straight sections faces away from a display area of a LCD, and the folding section is disposed on one side of a last bending section away from a last straight section, such that the controlling chip faces away the array substrate so that heat generated by the controlling chip does not reduce optical performance of the backlight module.

4. The LCD device according to claim 1, wherein the bonding area of the flexible packaging substrate is disposed on a bottom surface of the first straight section, and the bonding area of the flexible packaging substrate engages with the bonding area of the array substrate, and the controlling chip is configured on a bottom surface of the folding section.

* * * * *